United States Patent
Lee et al.

(10) Patent No.: US 11,075,245 B2
(45) Date of Patent: Jul. 27, 2021

(54) IMAGE SENSING DEVICE

(71) Applicant: SK hynix Inc., Icheon-si (KR)

(72) Inventors: Kyoung In Lee, Icheon-si (KR); Heon Joon Kim, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 16 days.

(21) Appl. No.: 16/545,543

(22) Filed: Aug. 20, 2019

(65) Prior Publication Data

US 2020/0185448 A1   Jun. 11, 2020

(30) Foreign Application Priority Data

Dec. 11, 2018   (KR) .......................... 10-2018-0159450

(51) Int. Cl.
| | |
|---|---|
| *H01L 27/146* | (2006.01) |
| *H04N 5/378* | (2011.01) |
| *H04N 5/369* | (2011.01) |
| *H04N 5/374* | (2011.01) |

(52) U.S. Cl.
CPC .... *H01L 27/14638* (2013.01); *H01L 27/1461* (2013.01); *H01L 27/1464* (2013.01); *H01L 27/14634* (2013.01); *H01L 27/14645* (2013.01); *H04N 5/374* (2013.01); *H04N 5/378* (2013.01); *H04N 5/379* (2018.08)

(58) Field of Classification Search
CPC ........... H01L 27/1461; H01L 27/14621; H01L 27/14627; H01L 27/14634; H01L 27/14636; H01L 27/14638; H01L 27/1464; H01L 27/14645
USPC ........................................................ 257/228
See application file for complete search history.

(56) References Cited

U.S. PATENT DOCUMENTS

| | | | |
|---|---|---|---|
| 9,620,540 B1* | 4/2017 | Yang ................. | H01L 27/14636 |
| 2013/0040415 A1* | 2/2013 | Arakawa ........... | H01L 27/14685 |
| | | | 438/68 |
| 2017/0179174 A1* | 6/2017 | Yang ................. | H01L 27/14614 |

FOREIGN PATENT DOCUMENTS

| | | |
|---|---|---|
| KR | 10-0781905 | 12/2007 |
| KR | 10-2016-0007217 | 1/2016 |

* cited by examiner

*Primary Examiner* — Long K Tran
(74) *Attorney, Agent, or Firm* — Perkins Coie LLP (57) ABSTRACT

An image sensing device to control flow of photocharges using a new method is disclosed. The image sensing device includes a photoelectric conversion region formed in a semiconductor substrate, a floating diffusion (FD) region formed apart from the photoelectric conversion region, a vertical pillar formed between the photoelectric conversion region and the floating diffusion region to transfer the photocharges from the photoelectric conversion region to the floating diffusion (FD) region, and a switching element located between the photoelectric conversion region and the floating diffusion (FD) region.

22 Claims, 6 Drawing Sheets

IMAGE SENSING DEVICE

CROSS-REFERENCE TO RELATED APPLICATION

This patent document claims the priority and benefits of Korean patent application No. 10-2018-0159450, filed on Dec. 11, 2018, which is hereby incorporated in its entirety by reference.

TECHNICAL FIELD

The technology and implementations disclosed in this patent document relate to an image sensing device.

BACKGROUND

An image sensing device is a device for capturing at least one image using semiconductor characteristics that react to light. In recent times, with the increasing development of computer industries and communication industries, demand for high-quality and high-performance image sensors is rapidly increasing in various fields, for example, digital cameras, camcorders, personal communication systems (PCSs), game consoles, surveillance cameras, medical micro-cameras, robots, etc.

Image sensing devices may be broadly classified into CCD (Charge Coupled Device)-based image sensing devices and CMOS(Complementary Metal Oxide Semiconductor)-based image sensing devices. Recently, since an analog control circuit and a digital control circuit can be directly implemented as a single integrated circuit (IC), CMOS-based image sensing devices have rapidly come into widespread use.

SUMMARY

Various embodiments of the disclosed technology are directed to an image sensing device which has an increased size of a photoelectric conversion element.

Various embodiments of the disclosed technology relate to an image sensing device which provides a controllable passage for photocharges transferred from a photoelectric conversion element to a floating diffusion (FD) region.

In accordance with an embodiment of the disclosed technology, an image sensing device may include a photoelectric conversion region formed in a semiconductor substrate and operable to detect light of a scene to produce photocharges, a floating diffusion (FD) region formed apart from the photoelectric conversion region and operable to store the photocharges, a vertical pillar formed between the photoelectric conversion region and the floating diffusion (FD) region and operable to transfer the photocharges from the photoelectric conversion region to the floating diffusion (FD) region, and a switching element located between the photoelectric conversion region and the floating diffusion (FD) region. A depletion region disposed between the photoelectric conversion region and the switching element may be enlarged or reduced in size in response to a control signal applied to the switching element, such that a transfer of the photocharges between the photoelectric conversion region and the floating diffusion (FD) region is controlled.

In accordance with another embodiment of the disclosed technology, an image sensing device may include a first substrate region, a second substrate region formed at a first surface of the first substrate region and including logic elements configured to transmit the photocharges stored in the floating diffusion (FD) region to a correlated double sampler (CDS), and a light transmission region disposed at a second surface of the first substrate region and configured to facilitate a passage of light to the photoelectric conversion region. The first substrate region may include a photoelectric conversion region operable to detect light of a scene to produce photocharges, a floating diffusion (FD) region formed apart from the photoelectric conversion region to temporarily store the photocharges produced in the photoelectric conversion region, and a switching element disposed between the photoelectric conversion region and the floating diffusion (FD) region. In the first substrate region, a transfer of the photocharges between the photoelectric conversion region and the floating diffusion (FD) region may be controlled by enlargement or reduction of a depletion region disposed between the photoelectric conversion region and the switching element.

In another aspect, an image sensing device is provided to comprise: a photoelectric conversion region formed in a semiconductor substrate and operable to produce photocharges in response to an incident light; a floating diffusion region formed over a portion of the photoelectric conversion region along a direction perpendicular to a surface of the semiconductor substrate; and a doping region formed between the photoelectric conversion region and the floating diffusion region along the direction and contacting another portion of the photoelectric conversion region, the doping region and the photoelectric conversion region including impurities with different polarities from each other.

BRIEF DESCRIPTION OF THE DRAWINGS

The above and other features and beneficial aspects of the present disclosure will become readily apparent with reference to the following detailed description when considered in conjunction with the accompanying drawings.

FIG. 5B is an example of a view illustrating that a current flowing between a photoelectric conversion region and a vertical pillar is turned on.

DETAILED DESCRIPTION

Reference will now be made in detail to certain embodiments, examples of which are illustrated in the accompanying drawings. Wherever possible, the same reference numbers will be used throughout the drawings to refer to the same or similar parts. In the following description, a detailed description of related known configurations or functions incorporated herein will be omitted to avoid obscuring the subject matter.

Demands for high-definition image sensing devices are rapidly increasing. To provide high-definition images, the number of unit pixels integrated into a pixel array need to increase. Thus, more unit pixels need to be integrated into a limited region, and a physical size of each unit pixel is reduced to integrate more unit pixels into the limited region. In this case, a photoelectric conversion element may also be reduced in size, resulting in deterioration in unit pixel characteristics. Therefore, there have been studies as to how to maximize the size of a photoelectric conversion element within a limited region.

The disclosed technology can be implemented to provide an image sensor including a photoelectric conversion element which has an increased size as compared to that in a conventional photoelectric conversion element. Some implementations of the disclosed technology allow to increase the size of the photoelectric conversion element by, for example, providing a passage for photocharges between the photoelectric conversion element and a floating diffusion region without forming a transfer transistor. Some implementations of the disclosed technology also allow to increase the size of the photoelectric conversion element by, for example, providing a floating diffusion (FD) region over a semiconductor substrate. Thus, it is possible to use even a region which were used to form a conventional transfer transistor and/or the floating diffusion (FD) region to form the photoelectric conversion element.

Figure 1:
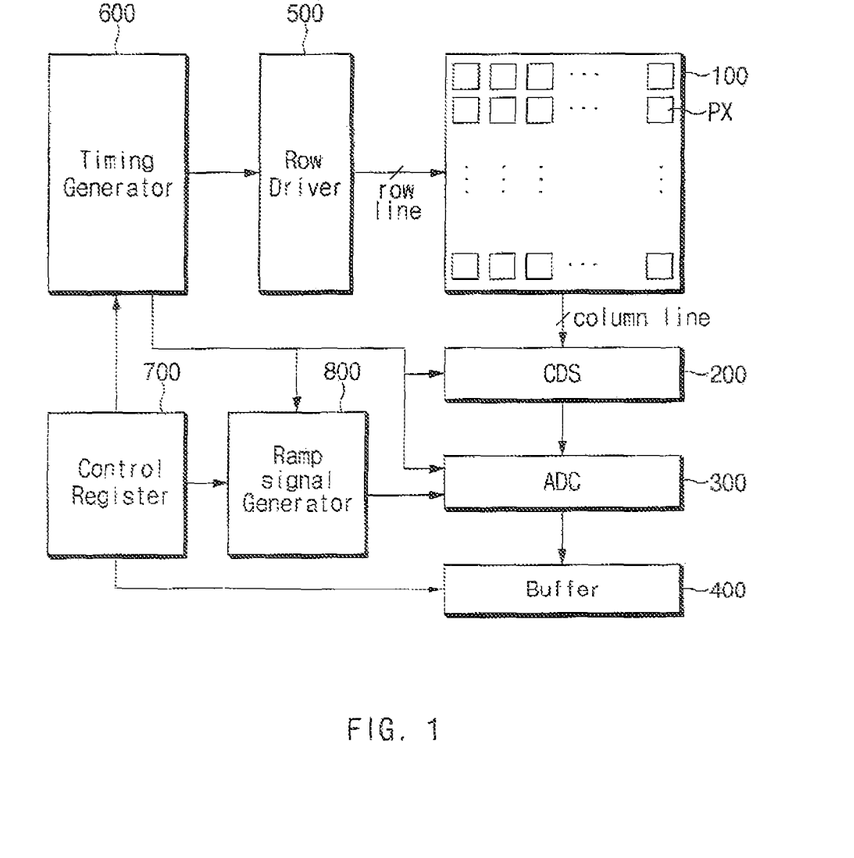
FIG. 1 is an example of a block diagram illustrating an image sensing device based on some implementations of the disclosed technology.

FIG. 1 is a block diagram illustrating an image sensing device based on some implementations of the disclosed technology.

Referring to FIG. 1, the image sensing device may include a pixel array 100, a correlated double sampler (CDS) 200, an analog-to-digital converter (ADC) 300, a buffer 400, a row driver 500, a timing generator 600, a control register 700, and a ramp signal generator 800.

The pixel array 100 may include a plurality of unit pixels (PXs) arranged in a matrix shape. Each of the unit pixels (PXs) may include a block of light sensing pixels (e.g., photodiodes) with each pixel being operable to sense light so that each pixel block 815 can convert optical image information into an electrical image signal, and may output the electrical image signal to the correlated double sampler (CDS) 200 through column lines. Each of the unit pixels (PXs) may be coupled to any one of row lines and any one of column lines. Under this design the unit pixels (PXs) respond to incident light containing an optical image to produce electrical image signals (e.g., photo charges) representing the optical image.

The correlated double sampler (CDS) 200 may hold and sample the electrical image signal received from the unit pixels (PXs) of the pixel array 100. For example, the correlated double sampler (CDS) 200 may perform sampling of a reference voltage level and a voltage level of the received electrical image signal in response to a clock signal received from the timing generator 600, and may transmit an analog signal corresponding to a difference between the reference voltage level and the voltage level of the received electrical image signal to the analog-to-digital converter (ADC) 300.

The analog-to-digital converter (ADC) 300 may compare a ramp signal received from the ramp signal generator 800 with a sampling signal received from the correlated double sampler (CDS) 200, and may thus output a comparison signal indicating the result of comparison between the ramp signal and the sampling signal. The analog-to-digital converter (ADC) 300 may count a level transition time of the comparison signal in response to a clock signal received from the timing generator 600, and may output a count value indicating the counted level transition time to the buffer 400.

The buffer 400 may store each of the digital signals received from the analog-to-digital converter (ADC) 300, may sense and amplify each of the digital signals, and may output each of the amplified digital signals. Therefore, the buffer 400 may include a memory (not shown) and a sense amplifier (not shown). The memory may store the count value, and the count value may be associated with output signals of the plurality of unit pixels (PXs). The sense amplifier may sense and amplify each count value received from the memory.

The row driver 500 may drive the pixel array 100 in units of a row line in response to an output signal of the timing generator 600. For example, the row driver 500 may generate a selection signal to select any one of the row lines. The selection signal may include a control signal to control on/off operations of a switching junction to be described later.

The timing generator 600 may generate a timing signal to control the row driver 500, the correlated double sampler (CDS) 200, the analog-to-digital converter (ADC) 300, and the ramp signal generator 800.

The control register 700 may generate control signals to control the ramp signal generator 800, the timing generator 600, and the buffer 400.

The ramp signal generator 800 may generate a ramp signal to control an image signal received from the buffer 400 in response to a control signal received from the timing generator 600.

Figure 2:
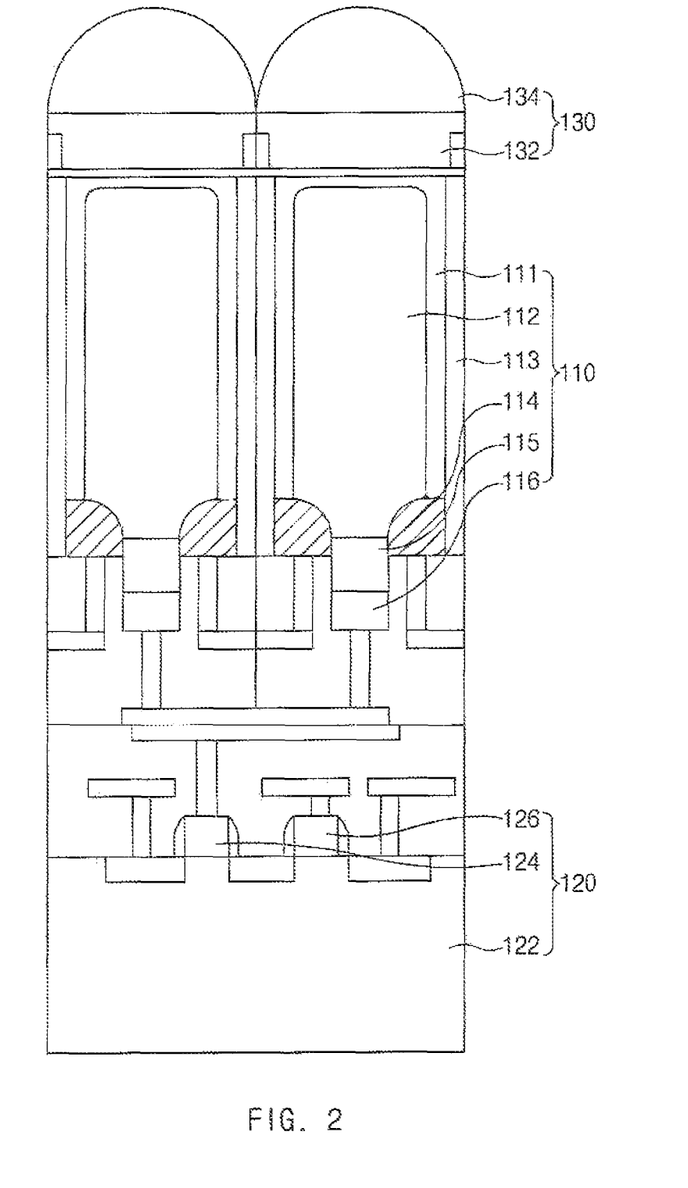
FIG. 2 is a view illustrating some parts of a pixel array shown in FIG. 1.

FIG. 2 is a view illustrating some parts of the pixel array 100 shown in FIG. 1.

Referring to FIG. 2, the pixel array 100 may include an upper substrate region 110, a lower substrate region 120, and a light transmission region 130.

The upper substrate region 110 may include a photoelectric conversion region 112 formed in an upper substrate 111. The upper substrate 111 may include a semiconductor substrate. The semiconductor substrate may include a monocrystalline silicon-containing material. The photoelectric conversion region 112 may convert incident light into an electrical signal.

In some implementations, the upper substrate region 110 may have a first surface over which the lower substrate region 120 is disposed and a second surface over which the light transmission region 130 is disposed. The upper substrate region 110 may include at least one switching element 114, at least one vertical pillar 115, and at least one floating diffusion (FD) region 116, which are formed over a first surface of the photoelectric conversion region 112 that is opposite to a second surface of the photoelectric conversion region 112. The light transmission region 130 is formed closer to the second surface than the first surface of the photoelectric conversion region 112.

The switching element 114 may be or include an impurity region that is formed by implanting high-density P-type impurities (P++) into an active region of each unit pixel defined by a device isolation film 113 to a predetermined depth. The switching element 114 may be disposed between the photoelectric conversion region 112 and the floating diffusion (FD) region 116. The switching element 114 may be formed over the photoelectric conversion region 112 so as to cover the photoelectric conversion region 112 in the upper substrate 111. In some implementations, the switching element 114 may be formed adjacent to the second surface of the photoelectric conversion region 112. In some implementations, the switching element 114 may be formed around at least one corner of the photoelectric conversion region 112. For example, when the vertical pillar 115 is formed on a portion of the second surface of the photoelectric conversion region 112, the switching element 114 may be formed on the remaining portion of the second surface of the photoelectric conversion region 112. In some implementations, the switching element 114 may extend to contact a portion of the vertical pillar 115.

The switching element 114 may receive a bias voltage (switching control signal) from a row driver 500. In response to the received bias voltage, the switching element 114 may turn on or off a passage of the photocharges transferred from the photoelectric conversion region 112 to the floating diffusion (FD) region 116. When the switching element 114 turns on the passage of the photocharges, the photocharges are transferred from the photoelectric conversion region 112 to the floating diffusion (FD) region 116. When the switching element 114 turns off the passage of the photocharges, the photocharges are not transferred from the photoelectric conversion region 112 to the floating diffusion (FD) region 116. The turning on or off of the passage of the photocharges occurs as the result of an increase or decrease of a depletion region disposed between the switching element 114 and the photoelectric conversion region 112, which is formed in response to the received bias voltage. For example, when the switching element 114 includes P-type impurities and the photoelectric conversion region 112 includes N-type impurities, depending on a polarity of the bias voltage, the depletion region formed between the switching element 114 and the photoelectric conversion region 112 increase or decrease. When the depletion region is increased, the passage of the photocharges from the photoelectric conversion region 112 to the floating diffusion (FD) region 116 is blocked. When the depletion region is decreased, the passage of the photocharges from the photoelectric conversion region 112 to the floating diffusion (FD) region 116 is open. In this manner, the switching element 114 including the impurity region can control the turning on or off of the passage of photocharges transferred from the photoelectric conversion region 112 to the floating diffusion (FD) region 116 according to the embodiment of the disclosed technology. Thus, the implementation of the disclosed technology does not need to separately form a transmission transistor TX (also called a transfer transistor TX) including an NMOS transistor, which can be omitted in the unit pixel, which results the increase of a space that can be used for the photoelectric conversion region 112. In this case, a bias voltage applied to the switching element 114 may be received from the row driver 500.

The vertical pillar 115 may be coupled to the second surface of the photoelectric conversion region 112 and a surface of the floating diffusion (FD) region 116. The photoelectric conversion region 112, the vertical pillar 115, and the floating diffusion (FD) region 116 may be formed in a direction perpendicular to the surface of the upper substrate region 110. The vertical pillar 115 may be disposed around a center part of the photoelectric conversion region 112 along a direction parallel to the surface of the upper substrate region 110. The vertical pillar 115 may include N-type impurities, and may include a graded doping profile in which an impurity density of the N-type impurities gradually increases as being closer to the floating diffusion (FD) region 116. The vertical pillar 115 may be used as a charge transmission path for transferring the photocharges produced by the photoelectric conversion region 112 to the floating diffusion (FD) region 116.

The floating diffusion (FD) region 116 may operate as a storage region in which charges transferred from the photoelectric conversion region 112 through the vertical pillar 115 are temporarily stored, and may be formed over the vertical pillar 115 such that the floating diffusion (FD) region 116 is coupled to the vertical pillar 115. For example, according to the embodiment of the disclosed technology, the floating diffusion (FD) region 116 may be formed over the photoelectric conversion region 112 along the direction perpendicular to the surface of the upper substrate region 110. Instead of being formed adjacent to the photoelectric conversion region 112 along the direction parallel to the surface of the upper substrate region 110. Therefore, the photoelectric conversion region 112 can be extended along the direction parallel to the surface of the upper substrate region by using a space that had been allocated to form a conventional floating diffusion (FD) region. The floating diffusion (FD) region 116 may include an N-type epitaxial layer.

The lower substrate region 120 may include plural logic elements (transistors) that are stacked over the first surface of the upper substrate region 110 in a manner that the logic elements (transistors) are in contact with the first surface of the upper substrate region 110. In some implementations, the logic elements (transistors) may transmit at least one signal stored in the floating diffusion (FD) region 116 of the upper substrate region 110 to the correlated double sampler (CDS) 200. The transistors may include a reset transistor RX (not shown), a driver transistor DX 124, and a selection transistor SX 126, which are formed over the lower substrate 122.

As described above, the logic elements operated to read out electrical signals (e.g., photocharges) are disposed in the lower substrate region 120 which is separated from the upper substrate region 110. For example, the constituent elements (e.g., the photoelectric conversion region 112) of each unit pixel may be formed in the upper substrate 111 and a plurality of elements configured to read out electrical signals converted by the photoelectric conversion region 112 to the correlated double sampler (CDS) 200 may be formed over the lower substrate 122. The upper substrate 111 and the lower substrate 122 may be coupled to each other via conductive lines, which provides a pixel stacking structure in which the unit pixel elements and the readout elements are formed in two different substrate regions 110 and 120.

The light transmission region 130 may be stacked over the second surface of the upper substrate region 110 that is opposite to the first surface of the upper substrate region 110 such that the light transmission region 130 is in contact with the second surface of the upper substrate region. The light transmission region 130 may include a color filter layer 132 and a plurality of microlenses 134.

The color filter layer 132 may include a plurality of red color filters, a plurality of green color filters, and a plurality of blue color filters, such that the color filter layer 132 may be formed to perform filtering of visible light so that only specific-color light R, G, or B from among visible light received through the microlenses 134 can pass through color filters of the color filter layer 132. The microlenses 134 may focus incident light received from an external part, and may transmit the focused incident light to the color filter layer 132.

Figure 3:
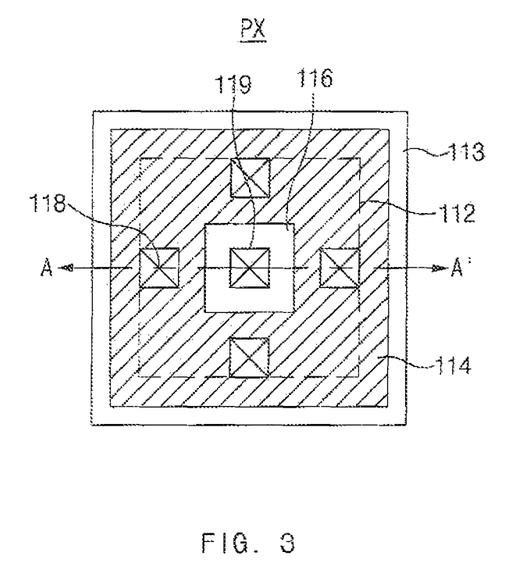
FIG. 3 is an example of a plan view illustrating a photoelectric conversion region and a switching element that are included in a unit pixel based on some implementations of the disclosed technology.
Figure 4:
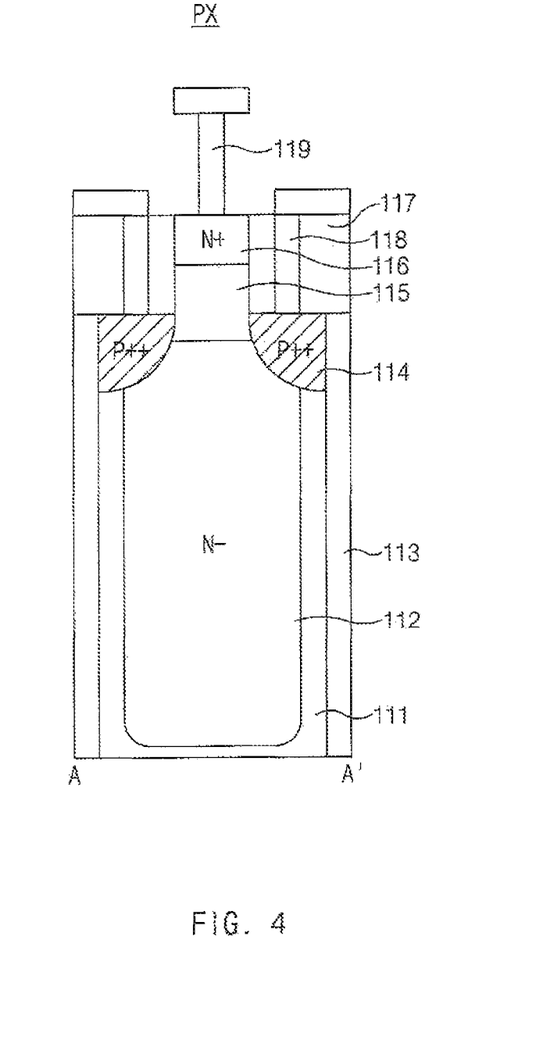
FIG. 4 is a cross-sectional view illustrating a pixel array taken along the line A-A' shown in FIG. 3.

FIG. 3 is a plan view illustrating structures of the photoelectric conversion region and the switching element for use in the unit pixel according to an embodiment of the disclosed technology. FIG. 4 is a cross-sectional view illustrating structures taken along the line A-A' shown in FIG. 3.

Referring to FIGS. 3 and 4, the photoelectric conversion region 112 may be formed in an active region defined by a device isolation film 113 in the upper substrate 111. The photoelectric conversion region 112 may include N-type impurities (N−). The device isolation film 113 may include a Shallow Trench Isolation (STI) region, a Deep Trench Isolation (DTI) region, or an impurity region.

The switching element 114 may include a P-type impurity region (P++) in which high-density P-type impurities (P++) are implanted, and may be formed over the photoelectric conversion region 112 in the active region defined by the device isolation film 113. For example, the switching element 114 may surround a contact region between the photoelectric conversion region 112 and the vertical pillar 115. In some implementations, the switching element 114 may have a belt shape surrounding the photoelectric conversion region 112. The switching element 114 may cover an upper portion of the photoelectric conversion region 112. In other words, the switching element 114 may cover the entirety of the remaining regions other than a specific portion that is coupled to the vertical pillar 115 at the first surface of the photoelectric conversion region 112. As described above, the high-density P-type impurity region (P++) may cover the first surface of the photoelectric conversion region 112, such that dark current characteristics caused by leakage current can be improved.

The switching element 114 may be formed to overlap with the vertical pillar 115 and the photoelectric conversion region 112 in a specific region in which the vertical pillar 115 is in contact with the photoelectric conversion region 112.

The switching element 114 may be coupled to the row driver 500 through at least one contact 118 and at least one conductive line, such that the switching element 114 may receive a switching control signal from the row driver 500. In some implementations, the switching element 114 may enlarge or reduce a depletion region disposed between the switching element 114 and the photoelectric conversion region 112 in response to the switching control signal. In some implementations, the switching element 114 may enlarge or reduce a depletion region disposed between the switching element 114 and the vertical pillar 115 in response to the switching control signal. Thus, the switching element 114 may selectively block (or close) a charge transmission path between the photoelectric conversion region 112 and the floating diffusion (FD) region 116. Thus, not only a depletion region formed in a junction region between the switching element 114 including the P-type impurities and the photoelectric conversion region 112 including the N-type impurities, but also a depletion region formed in a junction region between the switching element 114 including the P-type impurities and the vertical pillar 115 including the N-type impurities can be enlarged or reduced in response to the switching control signal applied to the switching element 114, such that flow of a current between the photoelectric conversion region 112 and the vertical pillar 115 may be turned on or off.

Although FIG. 3 illustrates four contacts 118 formed to surround the floating diffusion (FD) region 116 for convenience of description, the number of contacts is not limited to four and can be modified according to various factors, e.g., design needs.

The vertical pillar 115 may be formed to vertically extend from the photoelectric conversion region 112, and may be disposed between the photoelectric conversion region 112 and the floating diffusion (FD) region 116, such that the photoelectric conversion region 112 can be electrically coupled to the floating diffusion (FD) region 116. The vertical pillar 115 may be coupled to the center part of the photoelectric conversion region 112. The vertical pillar 115 may be formed in a manner that some parts of a contact region between the vertical pillar 115 and the switching element 114 can overlap with the switching element 114.

The vertical pillar 115 may include N-type impurities, and may include a graded doping profile in which an impurity density of the N-type impurities gradually increases as being closer to the floating diffusion (FD) region 116. The vertical pillar 115 may be used as a charge transmission path in which charges stored in the photoelectric conversion region 112 can move to the floating diffusion (FD) region 116.

The floating diffusion (FD) region 116 may be disposed over the vertical pillar 115 such that the floating diffusion (FD) region 116 can be directly coupled to the vertical pillar 115. For example, the floating diffusion (FD) region 116 may be disposed at an upper portion of the photoelectric conversion region 112 to be perpendicular to the photoelectric conversion region 112. The floating diffusion (FD) region 116 may include an epitaxial layer in which high-density N-type impurities (N+) are implanted. The floating diffusion (FD) region 116 may be coupled to the driver transistor 125 and the reset transistor that are formed in the lower substrate region 120 through a reset contact 119. The vertical pillar 115, the floating diffusion (FD) region 116, and the contacts 118 may be formed in an interlayer insulation film 117.

Figure 5A:
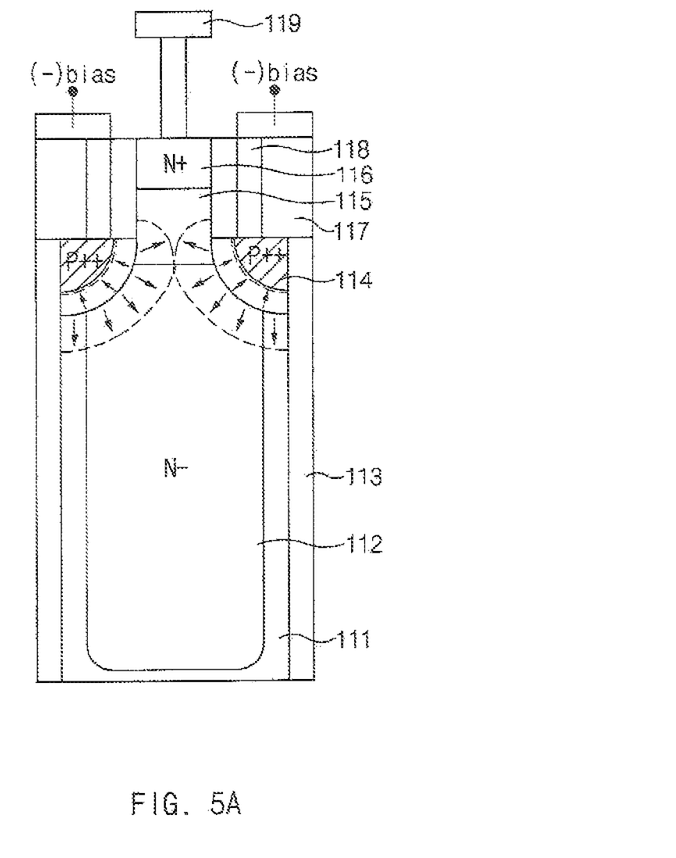
FIG. 5A is an example of a view illustrating that a current flowing between a photoelectric conversion region and a vertical pillar is turned off.
Figure 5B:
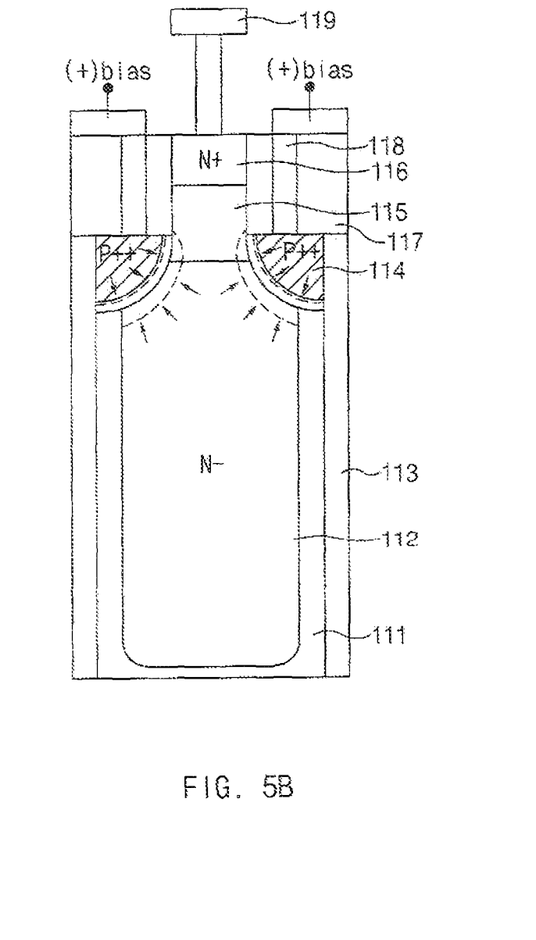

FIGS. 5A and 5B are views illustrating switching operations of the switching elements according to an embodiment of the disclosed technology. FIG. 5A is a view illustrating that a current flowing between the photoelectric conversion region and the vertical pillar is turned off because the depletion region disposed between the switching element and the photoelectric conversion region is extended by a voltage applied to the switching element. FIG. 5B is a view illustrating that a current flowing between the photoelectric conversion region and the vertical pillar is turned on because the depletion region disposed between the switching element and the photoelectric conversion region is reduced by a voltage applied to the switching element.

Referring to FIG. 5A, during a predetermined time in which photocharges generated by incident light received from an external part are accumulated in the photoelectric conversion region 112, a negative (−) bias voltage (e.g., a control signal) may be transmitted to the switching element 114 through the contacts 118, such that the switching element 114 may be turned off.

If the negative (−) bias voltage is applied to the switching element 114, the depletion region formed in a junction region between the switching element 114 corresponding to the P-type impurity region and the photoelectric conversion region 112 corresponding to the N-type impurity region may be enlarged in size. In addition, a depletion region formed in a junction region between the switching element 114 corresponding to the P-type impurity region and the vertical pillar 115 corresponding to the N-type impurity region may be enlarged in size.

In this case, since the switching element 114 may be formed in a belt shape enclosing the vertical pillar 115 at an upper portion of the photoelectric conversion region 112, the depletion region located closer to the photoelectric conversion region 112 may be formed to extend to a center part of the belt and may be in contact with the center part, such that a charge transmission path between the photoelectric conversion region 112 and the vertical pillar 115 may be closed. An impurity density in a surface of the photoelectric conversion region 112 formed by ion implantation may be lower than that of an inner part of the photoelectric conversion region 112. In addition, the vertical pillar 115 may include a graded doping profile in which an impurity density of a lower region contacting the photoelectric conversion region 112 is less than that of an upper region of the vertical pillar 115.

Therefore, the depletion region may more rapidly and more widely extend in a boundary region between the photoelectric conversion region 112 and the vertical pillar 115, and a fringing field formed to facilitate movement of charges in the N-type impurity region (N−) may not be developed or grown, such that movement of charges can be securely prevented.

Referring to FIG. 5B, in order to transmit photocharges accumulated in the photoelectric conversion region 112 to the floating diffusion (FD) region 116, a positive (+) bias voltage (e.g., control signal) is transmitted to the switching element 114 through the contacts 118, such that the switching element 114 can be turned on. If the positive (+) bias voltage is applied to the switching element 114, the extended depletion region shown in FIG. 5A may be reduced as shown in FIG. 5B, such that the charge transmission path between the photoelectric conversion element 112 and the vertical pillar 115 may be open. Therefore, photocharges accumulated in the photoelectric conversion region 112 may be transmitted to the floating diffusion (FD) region 116 through the vertical pillar 115.

As described above, the floating diffusion (FD) region 116 may be disposed in an upper portion of the photoelectric conversion region 112, the P-type impurity region (switching element) may be formed over the photoelectric conversion region 112, and the depletion region disposed between the photoelectric conversion region 112 and the switching element 114 may be selectively enlarged or reduced, such that movement of the photocharges flowing between the photoelectric conversion region 112 and the floating diffusion (FD) region 116 may be selectively blocked. Through the above-mentioned structure, since the p-type impurity region can control the movement of the photocharges by enlarging or reducing the depletion region formed between the photoelectric conversion region 112 and the switching element 114, the image sensing device according to the embodiments of the disclosed technology need not separately form a transmission transistor TX including an NMOS transistor in the unit pixel (PX).

Therefore, the image sensing device according to the embodiments of the disclosed technology can extend the photoelectric conversion region to a region which had been used to form the transmission transistor TX in a conventional semiconductor substrate. Thus, the image sensing device can increase the size of the photoelectric conversion region within a limited region as compared to the conventional art.

In the image sensing device according to the embodiments, the remaining portions of the surface of the photoelectric conversion region 112 other than a specific portion contacting the vertical pillar 115 may be covered with or contact a high-density P-type impurity (P++) region. As a result, although a dark current is created, the dark current can be discharged outside through the floating diffusion (FD) region 116, such that the dark current can be easily removed.

Although the above-mentioned embodiments have disclosed that the floating diffusion (FD) region 116 is disposed in an upper portion of the center part of the photoelectric conversion region 112 for convenience of description, other implementations are also possible. For example, the floating diffusion (FD) region 116 may be located anywhere in the upper portion of the photoelectric conversion region 112 without being limited to the upper portion of the center part of the photoelectric conversion region 112.

As is apparent from the above description, the image sensing device according to the embodiments of the disclosed technology can increase the size of each photoelectric conversion element within a limited region.

The image sensing device according to the embodiments of the present disclosure can improve dark current characteristics caused by leakage current.

Although a number of illustrative embodiments have been described, it should be understood that numerous other modifications and embodiments can be devised by those skilled in the art that will be made.

What is claimed is:

1. An image sensing device comprising:
   a photoelectric conversion region formed in a semiconductor substrate and operable to detect light of a scene to produce photocharges;
   a floating diffusion (FD) region formed apart from the photoelectric conversion region and operable to store the photocharges;
   a vertical pillar formed between the photoelectric conversion region and the floating diffusion (FD) region and operable to transfer the photocharges from the photoelectric conversion region to the floating diffusion (FD) region; and
   a switching element located between the photoelectric conversion region and the floating diffusion (FD) region,
   wherein the switching element is structured to control a transfer of the photocharges between the photoelectric conversion region and the floating diffusion (FD) region.

2. The image sensing device according to claim 1, wherein the floating diffusion (FD) region is located over a portion of the photoelectric conversion region along a direction perpendicular to a surface of the semiconductor substrate.

3. The image sensing device according to claim 2, wherein the floating diffusion (FD) region includes an N-type epitaxial layer.

4. The image sensing device according to claim 1, wherein the vertical pillar has a doping profile in which an impurity density gradually increases as being closer to the floating diffusion (FD) region.

5. The image sensing device according to claim 1, wherein the switching element covers a remaining portion of a surface of the photoelectric conversion region except a portion of the substrate of the photoelectric conversion region coupled to the vertical pillar.

6. The image sensing device according to claim 5, wherein the switching element has a belt shape surrounding the vertical pillar.

7. The image sensing device according to claim 5, wherein the switching element includes P-type impurities.

8. The image sensing device according to claim 1, wherein a depletion region disposed between the photoelectric conversion region and the switching element is enlarged or reduced in size in response to a control signal applied to the switching element, such that a transfer of the photocharges between the photoelectric conversion region and the floating diffusion (FD) region is controlled.

9. An image sensing device comprising:
   a first substrate region including:
      a photoelectric conversion region operable to detect light of a scene to produce photocharges, a floating diffusion (FD) region formed apart from the photoelectric conversion region to temporarily store the photocharges produced in the photoelectric conversion region, and a switching element disposed between the photoelectric conversion region and the floating diffusion (FD) region and structured to control a transfer of the photocharges between the photoelectric conversion region and the floating diffusion (FD) region;

a second substrate region formed at a first surface of the first substrate region and including logic elements configured to transmit the photocharges stored in the floating diffusion (FD) region to a correlated double sampler (CDS); and a light transmission region disposed at a second surface of the first substrate region and configured to facilitate a passage of light to the photoelectric conversion region, the second surface opposite to the first surface.

10. The image sensing device according to claim 9, wherein the floating diffusion (FD) region is located over a portion of the photoelectric conversion region along a direction perpendicular to a surface of the first substrate.

11. The image sensing device according to claim 10, wherein the floating diffusion (FD) region includes an N-type epitaxial layer.

12. The image sensing device according to claim 10, wherein the first substrate region further includes:
a vertical pillar formed to couple the photoelectric conversion region to the floating diffusion (FD) region.

13. The image sensing device according to claim 12, wherein the vertical pillar has a doping profile in which an impurity density gradually increases as being closer to the floating diffusion (FD) region.

14. The image sensing device according to claim 12, wherein the switching element includes P-type impurities.

15. The image sensing device according to claim 9, wherein a transfer of the photocharges between the photoelectric conversion region and the floating diffusion (FD) region is controlled by enlargement or reduction of a depletion region disposed between the photoelectric conversion region and the switching element.

16. An image sensing device comprising:
a photoelectric conversion region formed in a semiconductor substrate and operable to produce photocharges in response to an incident light;
a floating diffusion region formed over a portion of the photoelectric conversion region along a direction perpendicular to a surface of the semiconductor substrate; and
a doping region formed between the photoelectric conversion region and the floating diffusion region along the direction and contacting another portion of the photoelectric conversion region, the doping region and the photoelectric conversion region including impurities with different polarities from each other,
wherein the doping region is structured to control a transfer of the photocharges between the photoelectric conversion region and the floating diffusion region.

17. The image sensing device of claim 16, wherein the floating diffusion region and the photoelectric conversion region include n-type impurities.

18. The image sensing device of claim 16, wherein the floating diffusion region has a width smaller than that of the photoelectric conversion region.

19. The image sensing device of claim 16, wherein the doping region has a belt shape surrounding the photoelectric conversion region.

20. The image sensing device of claim 16, further comprising a pillar formed between the photoelectric conversion region and the floating diffusion region along the direction.

21. The image sensing device of claim 20, wherein the pillar has impurities with a doping profile in which an impurity density gradually increases as being closer to the floating diffusion (FD) region.

22. The image sensing device of claim 16,
wherein a transfer of the photocharges between the photoelectric conversion region and the floating diffusion region is controlled by enlargement or reduction of a depletion region disposed between the photoelectric conversion region and the doping region.

* * * * *